(12) United States Patent
Xu et al.

(10) Patent No.: US 10,879,152 B2
(45) Date of Patent: Dec. 29, 2020

(54) THROUGH MOLD VIA (TMV) USING STACKED MODULAR MOLD RINGS

(71) Applicant: Intel Corporation, Santa Clara, CA (US)

(72) Inventors: Yi Elyn Xu, Folsom, CA (US); Bilal Khalaf, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/348,133

(22) PCT Filed: Dec. 14, 2016

(86) PCT No.: PCT/US2016/066523
§ 371 (c)(1),
(2) Date: May 7, 2019

(87) PCT Pub. No.: WO2018/111253
PCT Pub. Date: Jun. 21, 2018

(65) Prior Publication Data
US 2019/0279919 A1    Sep. 12, 2019

(51) Int. Cl.
*H01L 23/48*    (2006.01)
*H01L 21/56*    (2006.01)
(Continued)

(52) U.S. Cl.
CPC ............ *H01L 23/481* (2013.01); *H01L 21/56* (2013.01); *H01L 21/565* (2013.01); *H01L 21/76898* (2013.01); *H01L 23/16* (2013.01); *H01L 23/3128* (2013.01); *H01L 23/48* (2013.01); *H01L 24/09* (2013.01); *H01L 24/17* (2013.01); *H01L 25/0652* (2013.01); *H01L 25/0657* (2013.01); *H01L 25/105* (2013.01);
(Continued)

(58) Field of Classification Search
CPC ............. H01L 27/768; H01L 27/76898; H01L 23/481; H01L 23/16; H01L 21/565
See application file for complete search history.

(56) References Cited

U.S. PATENT DOCUMENTS

2013/0161836 A1    6/2013  Yeom et al.
2014/0035892 A1*   2/2014  Shenoy .................. H01L 23/15
                                                     345/205
(Continued)

FOREIGN PATENT DOCUMENTS

KR        20130075251        7/2013

OTHER PUBLICATIONS

International Preliminary Report on Patentability from PCT/US16/66523 dated Jun. 27, 2019 11 pgs.
(Continued)

*Primary Examiner* — Phuc T Dang
(74) *Attorney, Agent, or Firm* — Green, Howard & Mughal LLP.

(57) ABSTRACT

An apparatus is provided which comprises: a substrate; a stacked ring structure disposed on the substrate, the stacked ring structure comprising a first ring and a second ring; a first partial through-mold-via (TMV) formed on the first ring; and a second partial TMV formed on the second ring, wherein the first ring and the second ring are stacked such that the first partial TMV is aligned on top of the second partial TMV.

18 Claims, 8 Drawing Sheets

(51) Int. Cl.
*H01L 21/768* (2006.01)
*H01L 23/31* (2006.01)
*H01L 23/00* (2006.01)
*H01L 25/065* (2006.01)
*H01L 25/00* (2006.01)
*H01L 23/16* (2006.01)
*H01L 25/10* (2006.01)
*H01L 23/538* (2006.01)

(52) U.S. Cl.
CPC .......... *H01L 25/50* (2013.01); *H01L 23/3121* (2013.01); *H01L 23/5384* (2013.01); *H01L 23/5385* (2013.01); *H01L 23/5389* (2013.01); *H01L 2224/12105* (2013.01); *H01L 2224/16145* (2013.01); *H01L 2224/16227* (2013.01); *H01L 2224/32145* (2013.01); *H01L 2224/32225* (2013.01); *H01L 2224/48145* (2013.01); *H01L 2224/48227* (2013.01); *H01L 2224/73204* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06548* (2013.01); *H01L 2225/06562* (2013.01); *H01L 2225/1023* (2013.01); *H01L 2225/1035* (2013.01); *H01L 2225/1041* (2013.01); *H01L 2225/1058* (2013.01); *H01L 2924/1533* (2013.01); *H01L 2924/15311* (2013.01); *H01L 2924/181* (2013.01)

(56) References Cited

U.S. PATENT DOCUMENTS

| | | | |
|---|---|---|---|
| 2014/0038390 A1* | 2/2014 | Yang | H01L 23/585 438/462 |
| 2016/0056197 A1* | 2/2016 | Chen | H01L 27/1464 257/447 |
| 2016/0079214 A1 | 3/2016 | Caskey et al. | |
| 2016/0240515 A1 | 8/2016 | Keeth et al. | |
| 2016/0284677 A1 | 9/2016 | Lin et al. | |
| 2016/0358834 A1* | 12/2016 | Xu | H01L 24/32 |

OTHER PUBLICATIONS

International Search Report and Written Opinion for International Patent Application No. PCT/US2016/066523, dated Aug. 25, 2017.

* cited by examiner

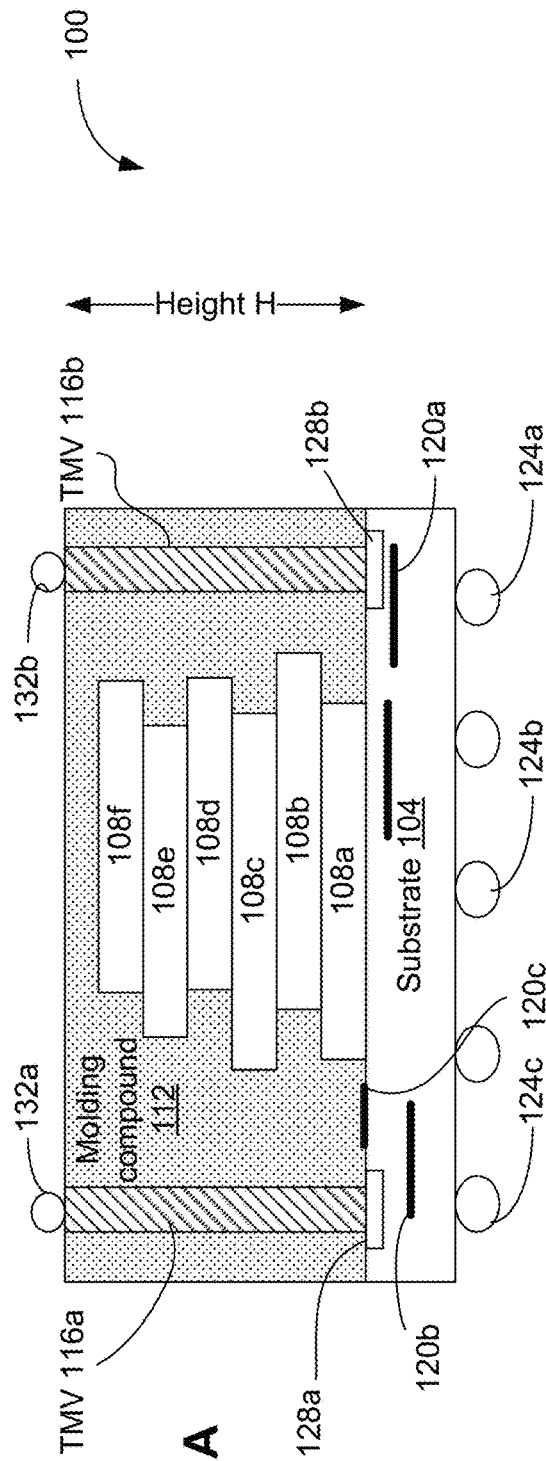
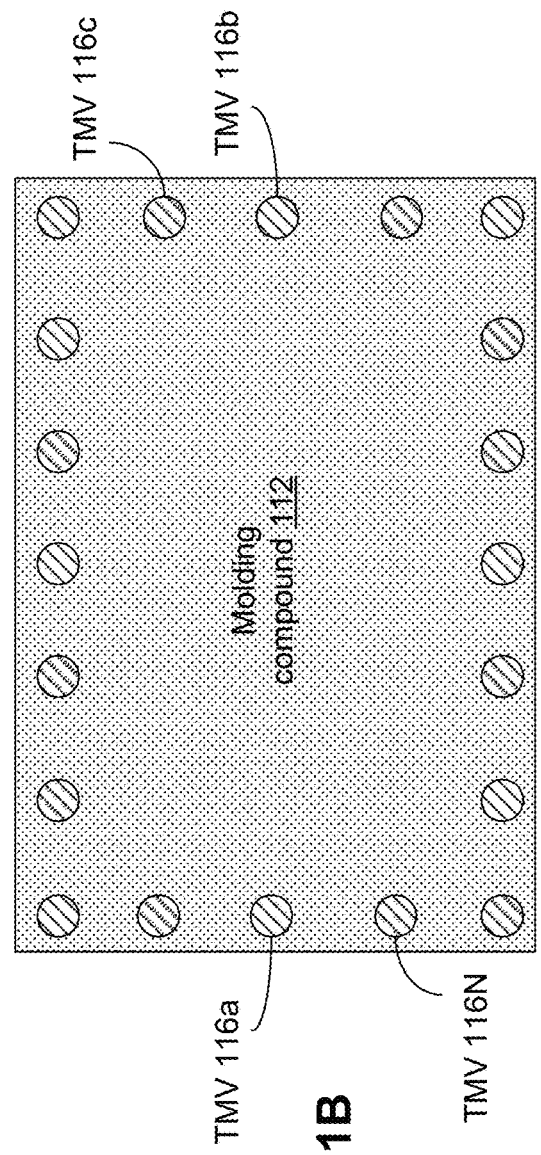

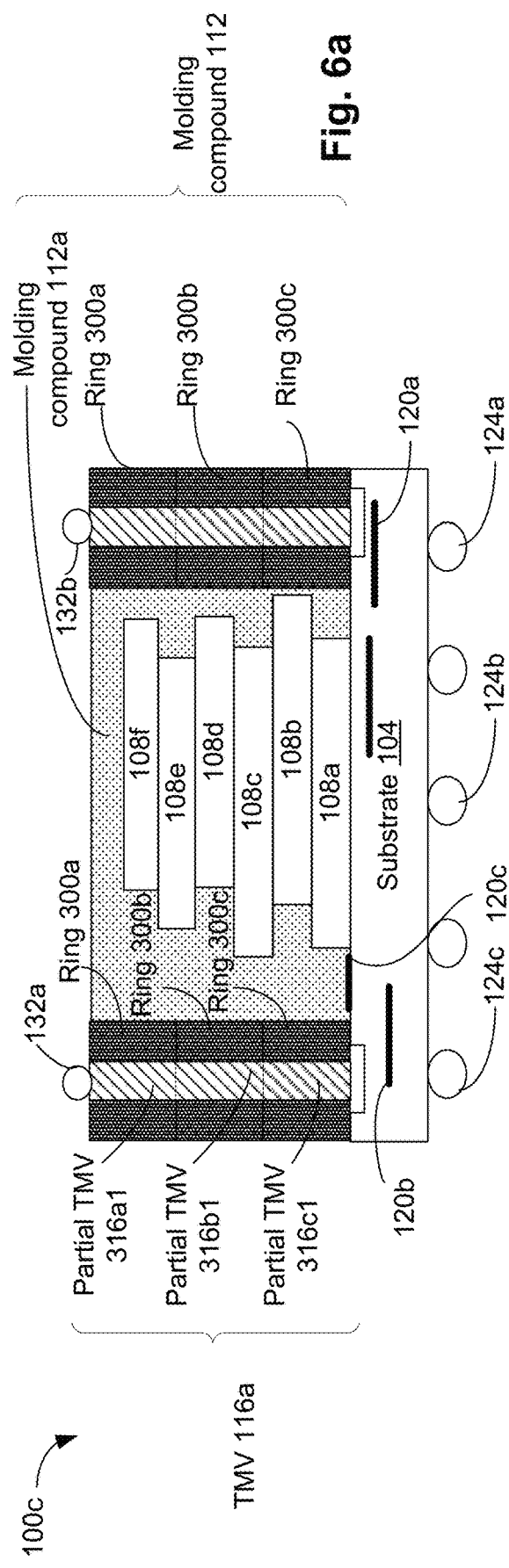
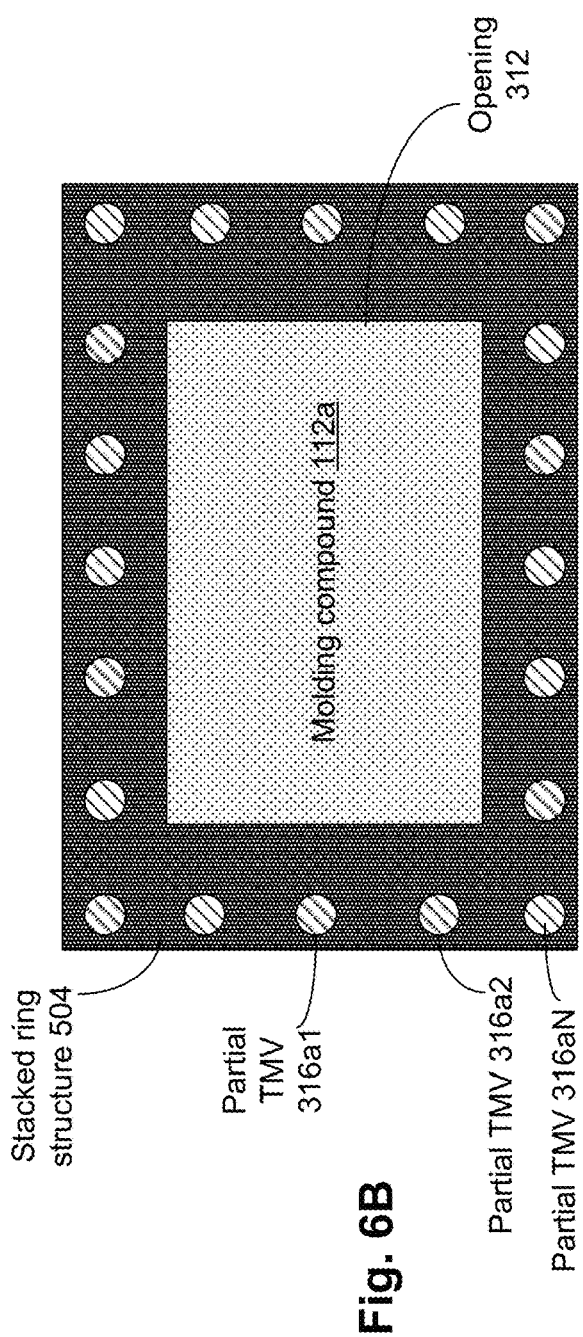
Fig. 6a
Fig. 6B

THROUGH MOLD VIA (TMV) USING STACKED MODULAR MOLD RINGS

CLAIM OF PRIORITY

This Application is a National Stage Entry of, and claims priority to, PCT Application No. PCT/US16/66523, filed on 14 Dec. 2016 and titled "THROUGH MOLD VIA (TMV) USING STACKED MODULAR MOLD RINGS", which is incorporated by reference in its entirety for all purposes.

BACKGROUND

A through-mold-via (TMV) is a via through a molding compound, where the molding compound, for example, encapsulates various components of a semiconductor package. Conventionally, TMVs can be formed by laser drilling (or mechanically drilling) holes in the molding compound, and filling the holes with solder or other appropriate conductive material.

For a high-density package employing, for example, multiple stacked dies, a height of the packages can be large, thereby resulting in a relatively large height of the molding compound in the package. When drilling a hole in the molding compound with relatively large height, the diameter of the hole can get relatively large (e.g., compared to when the hole is drilled in a molding compound with a small height). In some examples, the top portion of the hole can have a larger diameter, compared to a bottom portion of the hole (e.g., the hole can be tapered). The thicker the package, the higher can be the diameter of the top portion of a TMV. Having a large diameter TMV results in misuse of the package area, and it may be difficult in detecting any potential defect in a large diameter TMV.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A is a cross sectional view illustrating a semiconductor package and FIG. 1B is a top view illustrating the semiconductor package, according to some embodiments.

FIGS. 3A, 3B, 4, 5A, 5B, 6A, and 6B illustrate a process for forming a semiconductor package, including formation of a plurality of TMVs using a stacked ring structure, according to some embodiment.

DETAILED DESCRIPTION

Figure 2:
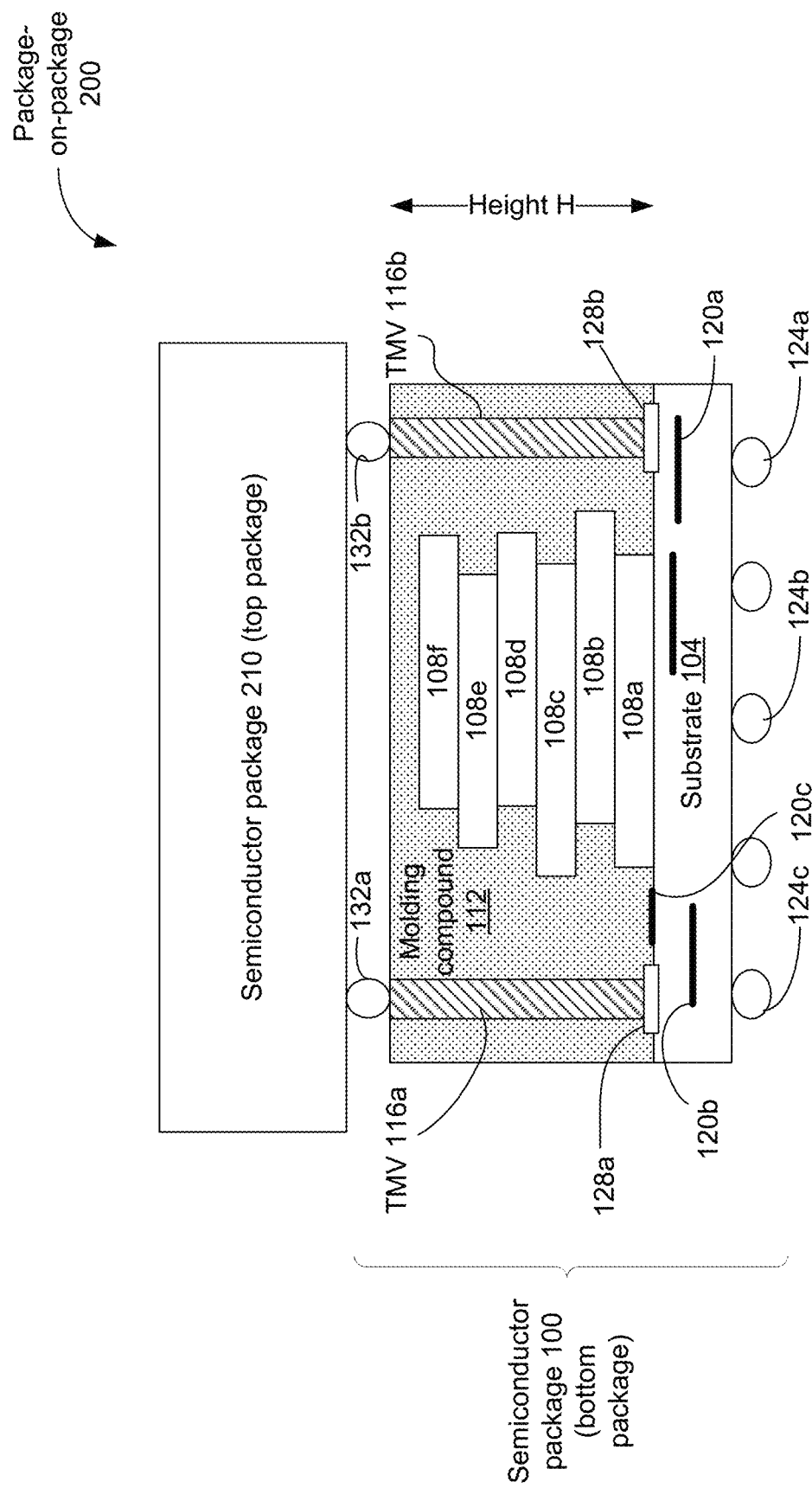
FIG. 2 illustrates a package-on-package (POP) structure in which the package of FIGS. 1A-1B form a bottom package, according to some embodiments.

A semiconductor package can include a molding compound encapsulating one or more semiconductor chips of the package. Often, one or more TMVs are to be formed through the molding compound. Such TMVs, for example, facilitate electrical connections between a substrate of the package and another semiconductor package in a package-on-package structure.

In a conventional system, often times, if a height of the molding compound is relatively large (e.g., due to a number of semiconductor chips being stacked in a package), a hole for a TMV in the molding compound becomes relatively large in diameter (e.g., because the laser has to drill a long hole, which also results in a larger diameter hole). Moreover, the diameter at a top section of the hole can be larger than the diameter at a bottom section of the hole (e.g., the hole can have non-uniform diameter along the length of the hole). Having large diameter TMVs results in misuse of die area, and it may be difficult in detecting any potential defect in such a large TMV.

In some embodiments, the TMVs are formed using multiple modular mold rings. For example, initially, a plurality of rings are formed, where each ring has a corresponding opening defined in a middle section of the ring. In each ring, a plurality of holes are formed, which are then filed with conductive material such as solder (or another conductive material). Each hole in a ring correspond to a TMV that is to be formed in the package. The holes can be formed using laser drilling or mechanical drilling. Subsequently, the rings are stacked to form a stacked ring structure. In the stacked ring structure, the corresponding holes of individual rings are aligned, such that a plurality of TMVs are formed in the stacked ring structure. Subsequently, the stacked ring structure, having the pre-fabricated TMVs, is placed on the substrate.

There are many technical effects of the various embodiments. For example, drilling holes in individual rings is easier, e.g., compared to drilling holes in the entire molding compound. For example, individual rings have relatively less height. Accordingly, the holes in individual rings can be smaller in diameter, thereby resulting in smaller diameter of the TMVs in the stacked ring structure. This reduces the footprint of the TMVs in the package, thereby enabling formation of a larger number of TMVs (and consequently, large number of connections of a package).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1A is a cross sectional view illustrating a semiconductor package 100 (henceforth referred to as a "package 100") and FIG. 1B is a top view illustrating the package 100, according to some embodiments. As will be discussed in further detail herein later, package 100 comprises a plurality of TMVs 116a that are, for example, formed using multiple stacked pre-formed mold rings.

In some embodiments, package 100 includes, for example, a substrate 104 on which plurality of semiconductor chips 108a, . . . , 108f (henceforth generally referred to as a semiconductor chip 108 in singular, or semiconductor chips 108 in plural) may be mounted. In the example of FIG. 1A, the semiconductor chips 108a, . . . , 108f are stacked, although the semiconductor chips 108a, . . . , 108f can be mounted in any other appropriate configuration (e.g., at least some of the semiconductor chips can be arranged in a side by side configuration). Although FIG. 1A illustrates the semiconductor chips 108a, . . . , 108f being stacked and mounted on a substrate 104, in another example, (and although not illustrated in the figures), the semiconductor chips 108a, . . . , 108f can be stacked and mounted on another component (e.g., on another semiconductor chip, for example, in which case the another semiconductor chip would replace the substrate 104 in FIG. 1A).

Individual ones of the semiconductor chips 108 can be, for example, memory chips, logic chips, integrated circuit chips comprising one or more processors, an application specific integrated circuit (ASIC), a processor, a radio frequency integrated circuit, a baseband processor, a system on a chip (SOC), and/or any other appropriate type of semiconductor chip.

In some embodiments, the semiconductor chips 108a, . . . , 108f are electrically connected to the substrate 104 using any appropriate arrangement (not illustrated in the figures). For example, the semiconductor chips 108a, . . . , 108f can be wire-bonded to the substrate 104 using a plurality of bonding wires (not illustrated in the figures). In another example, the bottom semiconductor chip 108a can be attached to substrate 104 in a flip-chip configuration. One or more of the semiconductor chips 108 can have through-silicon-vias (TSVs), through which one or more of the semiconductor chips 108 can be electrically connected to the substrate. Although FIG. 1A illustrates the semiconductor chips 108 being stacked without any intervening layers in between, in some examples, various components can be present within or between the semiconductor chips 108, e.g., one or more interposers, solder bumps, solder balls, bonding wires, TSVs, adhesive layers, under-fill layer, and/or the like.

In some embodiments, a semiconductor chip 108 can represent a single semiconductor chip, or may include two or more dies. In some embodiments, a semiconductor chip 108 may be a wafer (or portion of a wafer) having two or more dies formed on it. In some embodiments, a semiconductor chip 108 can include two or more dies embedded in an encapsulant.

The semiconductor chips 108a, . . . , 108f can be attached to each other, and to the substrate 104 using, for example, adhesive layers (not illustrated in the figures). For example, an adhesive layer can attach a bottom surface of the semiconductor chip 108a to a top surface of the substrate 104, another adhesive layer can attach a top surface of the semiconductor chips 108a to a bottom surface of the semiconductor chips 108b, and so on.

In some embodiments, a plurality of external terminals 124 (e.g., external terminals 124a, 124b, 124c) can be attached to a bottom surface of the substrate 104. The external terminals 124, for example, can electrically connect the package 100 to an external device or devices (not illustrated in the figures). The external terminals 124 can include any of a wide variety of suitable structures and/or materials, including, for example, bumps, pillars, or balls formed using metals, alloys, solderable material, or their combinations. In some embodiments, the external terminals 124 can be arranged in a ball grid array ("BGA") or other configuration.

In some embodiments, the substrate 104 can be a printed circuit board, a printed board assembly, a motherboard, and/or another appropriate type of substrate. In some embodiments, the substrate 104 comprises electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material.

In some embodiments, the substrate 104 can include one or more electrical members 120a, 120b, 120c. Individual ones of the electrical members 120a, 120b, 120c comprises, for example, a ground plane, a power plane, traces, trenches, interconnects within the substrate 104, re-distribution layers (RDLs), and/or the like.

In some embodiments, the semiconductor chips 108a, . . . , 108f are encapsulated using a molding compound 112. The molding compound 112 can be of any appropriate type used for encapsulating semiconductor chips. Formation of the molding compound 112 is discussed in further details herein later.

FIGS. 1A and 1B further illustrate a plurality of TMVs 116a, 116b, 116c, . . . , 116N, which are generally referred to herein as a TMV 116 in singular, and TMVs 116 in plural. In the cross-sectional view of FIG. 1A, only two TMVs 116a, 116b are visible—however, the package 100 comprises the plurality of TMVs, as illustrated in the top view of FIG. 1B. In some embodiments, the TMVs are disposed through the molding compound 112. In some embodiments, the TMVs 116 are filled with an appropriate conducting material, e.g., solder. Formation of the TMVs 116 are discussed in further details herein later.

Although FIGS. 1A and 1B illustrate the TMVs 116 arranged in a single row along a periphery of the package 100, the TMVs 116 can be disposed in the package 100 in any other appropriate manner. Merely as an example and although not illustrated in FIGS. 1A and 1B, instead of a single row of the TMVs 116, the package 100 can include multiple (e.g., two) rows on TMVs 116.

In some embodiments, the TMVs 116 are coupled to the substrate 104 via corresponding landing pads 128 formed on the top surface of the substrate 104. For example, a bottom end of the TMV 116a is connected to the substrate 104 via a landing pad 128a, a bottom end of the TMV 116b is connected to the substrate 104 via a landing pad 128b, and so on.

In some embodiments, a top end of individual TMV 116 is coupled to a corresponding interconnect structure 132. For example, a top end of the TMV 116a is coupled to an interconnect structure 132a, a top end of the TMV 116b is coupled to an interconnect structure 132b, and so on. The interconnect structures 132, for example, include any of a wide variety of suitable structures and/or materials including, for example, bumps, pillars, or balls formed using metals, alloys, solderable material, or their combinations.

In some embodiments, the package 100 is connected to another package via the interconnect structures 132, e.g., to form a POP structure. In some embodiments, a TMV 116 forms an electrical connection between a corresponding interconnect structure 132 and a corresponding pad 128.

The top view of FIG. 1B illustrates the molding compound 112 and the TMVs 116. It is to be noted that although interconnect structures 132 are disposed on top of the TMVs 116, the interconnect structures 132 are not illustrated in the top view of FIG. 1B. Accordingly, the TMVs 116 are visible in the top view of FIG. 1B.

In some embodiments, package 100 forms a bottom package of a POP structure. For example, FIG. 2 illustrates a POP structure 200 in which the package 100 of FIGS. 1A-1B form a bottom package, according to some embodiments. The POP structure 200 comprises the package 100 as the bottom package, and a semiconductor package 210 (henceforth also referred to as a "package 210") as a top package. The packages 100 and 210 are, for example, electrically connected via interconnect structures 132.

In some embodiments, the package 210 can be of any appropriate type of top package in a POP structure. In an example, the package 210 comprises one or more semiconductor chips disposed on a substrate, one or more TMVs, one or more through-silicon-vias (TSVs), wire bonds, bonding pads, traces, power planes, ground planes, re-distribution layers (RDL), package interconnect structures, solder bumps, and/or the like. Although the principles of this disclosure are discussed with respect to the bottom package 100, the principles can also be applied to the top package 210 as well. Internal structure and details of the top package 210 are not presented herein, in order to not obfuscate the teachings of this disclosure.

Referring again to FIG. 1A, in some embodiments, because several semiconductor chips 108 are stacked in the package 100, a height of the package 100 is relatively large (e.g., compared to a package that has a single semiconductor chip, or two stacked semiconductor chips). The height of the package 100 can be relatively large for any other reason as well (e.g., due to a presence of other passive or active components in the package, not illustrated in the figures). For example, FIG. 1A illustrates a height H of the molding compound 112. Merely as an example, the height H is about 800 microns.

In a conventional system, TMVs are drilled using a laser drill or a mechanical drill. If a height of a molding compound of a conventional system is relatively large (e.g., 800 microns), a diameter of a TMV through the molding compound becomes relatively large, e.g., to enable the laser drill to fully drill through the molding compound. In the conventional system, such a TMV can also have a non-uniform diameter (e.g., because the laser has to drill down a long way in the molding compound, the hole of the TMV can be large in diameter and tapered in one end). The teachings of this disclosure solve this issue, for example, by using multiple pre-fabricated ring-like structures, each having relatively less height, for fabricating the TMVs 116, as discussed in detail herein below.

Figure 3:
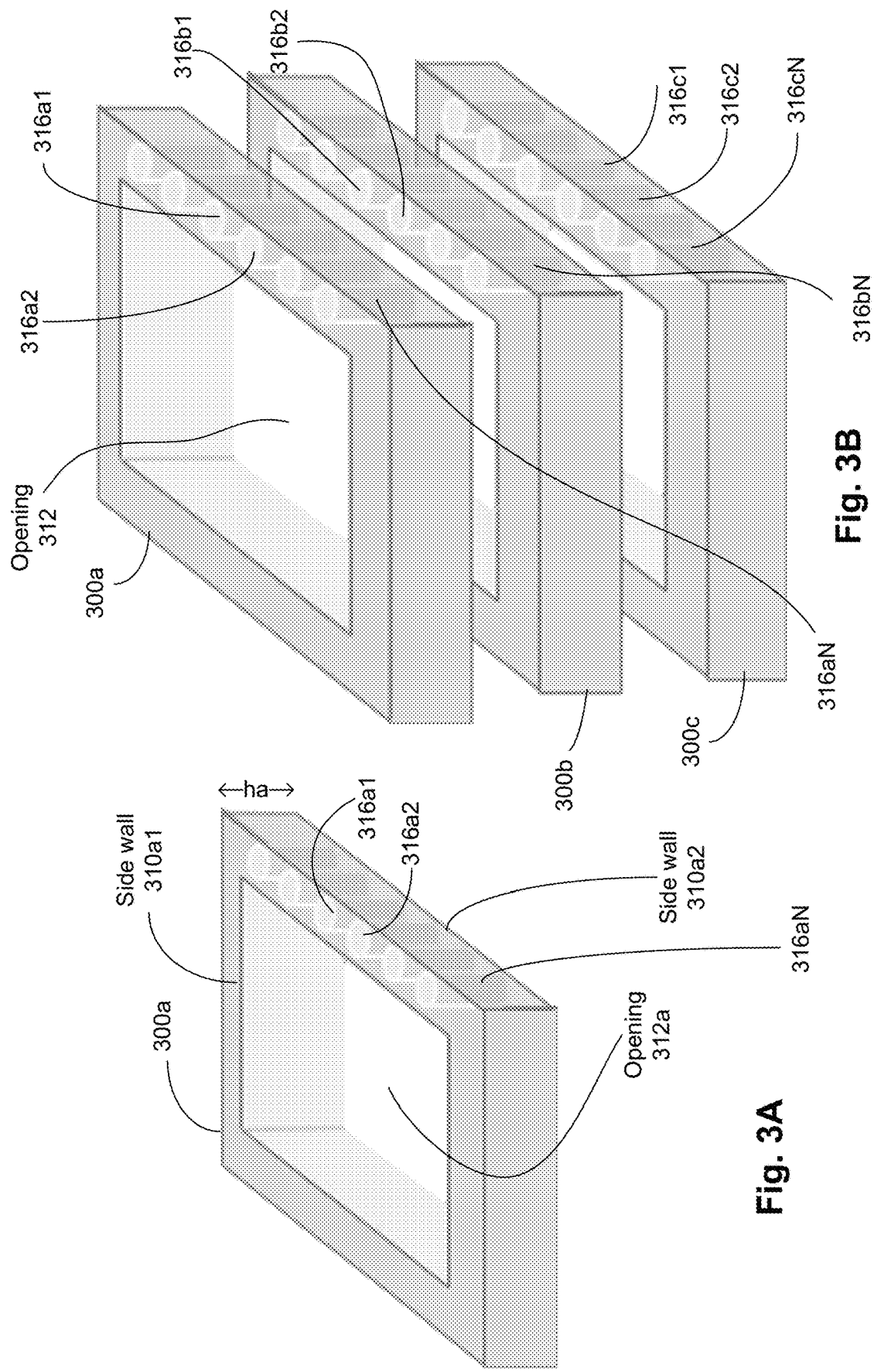

FIGS. 3A, 3B, 4, 5A, 5B, 6A, and 6B illustrate a process for forming the package 100 of FIGS. 1A-1B, including the formation of the TMVs 116, according to some embodiment. Referring to FIG. 3A, this figure illustrates a mold ring (henceforth referred to as "ring") 300a. The ring 300a, for example, is rectangular shaped to conform to the configuration in which the TMVs 116 are disposed on the package 100 of FIGS. 1A-1B. The ring 300a, for example, has four side walls on four sides, and the inside or middle section of the ring 300a is open. Two example side walls 310a1 and 310a2 are labeled in FIG. 3A. An opening 312a inside the ring 300a (e.g., in between the four side walls) is also illustrated in FIG. 3A. In an example, an outer dimension of the ring 300a corresponds to a desired outer dimension of the molding compound 112 of FIGS. 1A-1B.

In some embodiments, a sidewall (e.g., sidewall 310a2) of the ring 300a has a corresponding plurality of through holes filed with conductive material (e.g., solder, metal, metal alloy, or another appropriate type of conductive material), which are referred to herein as partial TMVs. For example, the sidewall 310a2 is illustrated to include partial TMVs 316a1, 316a2, . . . , 316aN, referred to herein as a partial TMV 316a in singular, and partial TMVs 316a in plural. Although FIG. 3A illustrates only a single sidewall (e.g., sidewall 310a2) including the partial TMVs 316a, in some embodiments, each of the four sidewalls include such partial TMVs 316a.

In some embodiments, the positions of the partial TMVs 316a in the ring 300a correspond to the positions of the TMVs 116 in FIGS. 1A-1B. Merely as an example, in FIGS. 1A-1B, the TMVs 116 are arranged in a single row along all four sides of the periphery of the package 100. Accordingly, in FIG. 3A, the partial TMVs 316a are also arranged in a single row along all four sidewalls of the ring 300a (although, as discussed above, for purposes of illustrative clarity, only a single sidewall 310a2 is shown to include the partial TMVs 316a). If, for example, package 100 were to include two rows of TMVs 116 (although the example of FIGS. 1A-1B illustrate only a single row), the sidewalls of the ring 300a would also have included two such rows of partial TMVs 316a.

In some embodiments, the sidewalls of the ring 300a comprises an appropriate molding compound. For example, the molding compound used for the ring 300a can be same as the molding compound 112, or may be different. In some embodiments, the ring 300a can comprise any suitable material, such as epoxy-based build-up substrate, other dielectric/organic materials, resins, epoxies, polymer adhesives, silicones, acrylics, polyimides, cyanate esters, thermoplastics, thermal interface material, and/or thermosets.

The ring 300a may be fabricated in any appropriate manner. For example, the ring 300a can be fabricated by flowing an appropriate molding compound in a hollow structure that is in the shape of the ring 300a.

It is to be noted that while the height of the molding compound 112 in FIGS. 1A-1B is H, a height of the ring 300a is ha. In some embodiments, the height ha is considerably or substantially less than the height H. For example, if three rings are used to form the TMVs 116 of FIGS. 1A-1B (e.g., as discussed herein later), the height ha can be about one-third (e.g., ⅓) of the height H.

In some embodiments, the partial TMVs 316a of the ring 300a can be fabricated, for example, while the ring 300a is fabricated. In some other embodiments, the ring 300a is fabricated without the partial TMVs 316a, e.g., fabricated with only the four sidewalls. In such embodiments, holes corresponding to the partial TMVs 316a are drilled subsequently, e.g., using a laser drill and/or using a mechanical drill. In an example, because the height ha of the ring 300a is relatively less (e.g., compared to the height H of the molding compound 112 of FIGS. 1A-1B), the holes of the partial TMVs 316a can be drilled mechanically (although in other examples, the partial TMVs 316a can be formed using laser drilling). Once the holes are drilled, the holes are filed with appropriate conductive material, e.g., solder, a metal or metal alloy, or another appropriate conductive material, to form the partial TMVs 316a.

In some embodiments, because the height ha of the ring 300a is relatively small (e.g., compared to the height H), the holes of the partial TMVs 316a can have relatively less diameter (e.g., compared to a convention system where a via is formed in a molding compound having a height of H). Also, in an example, the diameter of a hole in the ring 300a is relatively constant along the length of the hole (e.g., compared to a convention system where a hole for a via is formed in a molding compound having a height of H, and such a hole has a tapered shape, with a non-uniform diameter along the length of the hole).

In some embodiments, the height ha of the ring 300a is chosen such that small holes (e.g., holes with less diameter) for the partial TMVs 316a can be formed within the ring 300a. For example, if the height ha is too large, the holes may tend to be larger in diameter and may have non-uniform diameter along the length of a hole. On the other hand, if the height ha is too small, a large number of rings may be needed to form the TMVs 116. Merely as an example, the height ha of the ring 300a can be between about 100-300 microns, although any other appropriate range of height is also possible.

FIG. 3B illustrates multiple rings 300a, 300b, and 300c that are about to be stacked, according to some embodiments. The rings 300a, 300b, 300c are generally also referred to herein as a ring 300 in singular, and rings 300 in plural.

Although only three rings are illustrated in FIG. 3B, more (or less) number of rings can also be stacked. As an example, the number of rings can be based on a ratio of H/ha, where H is the height of the molding compound 112 in FIGS. 1A-1B, and ha is the height of the ring 300a. Merely as an example, if the height H is about 800 microns, and the height ha is about 200 microns, then about 4 rings are to be stacked.

In some embodiments, the rings 300b and 300c are similar to the ring 300a. In an example, the ring 300b has partial TMVs 316b1, 316b2, ..., 316bN (generally also referred to herein as a partial TMV 316b in singular, and partial TMVs 316b in plural) formed on the sidewalls of the ring 300b (although FIG. 3B illustrates the partial TMVs 316b formed only on one sidewall of the ring 300b). Similarly, the ring 300c has partial TMVs 316c1, 316c2, ..., 316cN (generally also referred to herein as a partial TMV 316c in singular, and partial TMVs 316c in plural) formed on the sidewalls of the ring 300c (although FIG. 3c illustrates the partial TMVs 316c formed only on one sidewall of the ring 300c). The partial TMVs 316a, 316b, and 316c are generally also referred to herein as a partial TMV 316 in singular, and partial TMVs 316 in plural.

In some embodiments and although not labelled separately, similar to the opening 312a in the ring 300a, the rings 300b and 300c also has corresponding openings 312b and 312c in respective middle section of the rings 300b and 300c. When the rings 300a, 300b, and 300c are stacked, the openings 312a, 312b and 312c align to form an opening 312 in the stacked ring structure, as illustrated in FIG. 3B. The opening 312 extend throughout the stacked ring structure.

Figure 4:
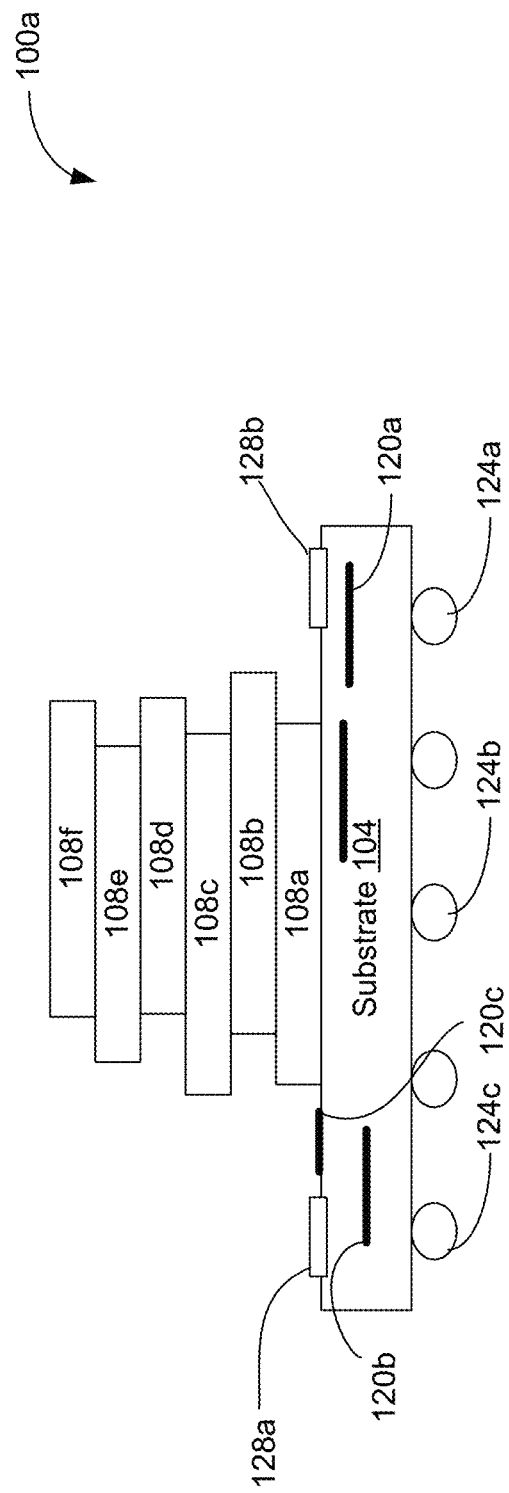

FIG. 4 illustrates a partially formed package 100a, according to some embodiments. The package 100a is similar to the package 100 of FIG. 1A, but without the molding compound 112, the TMVs 116, and the interconnect structures 132. The package 100a can be formed using any appropriate manner to form such a partial package.

Figure 5A:
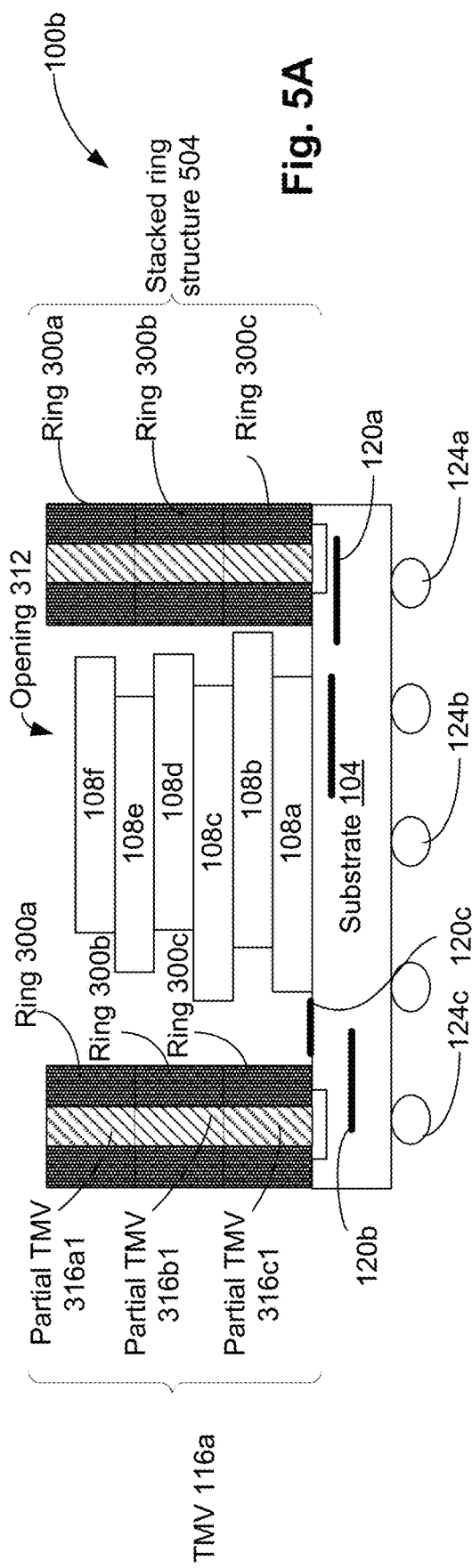
Figure 5B:
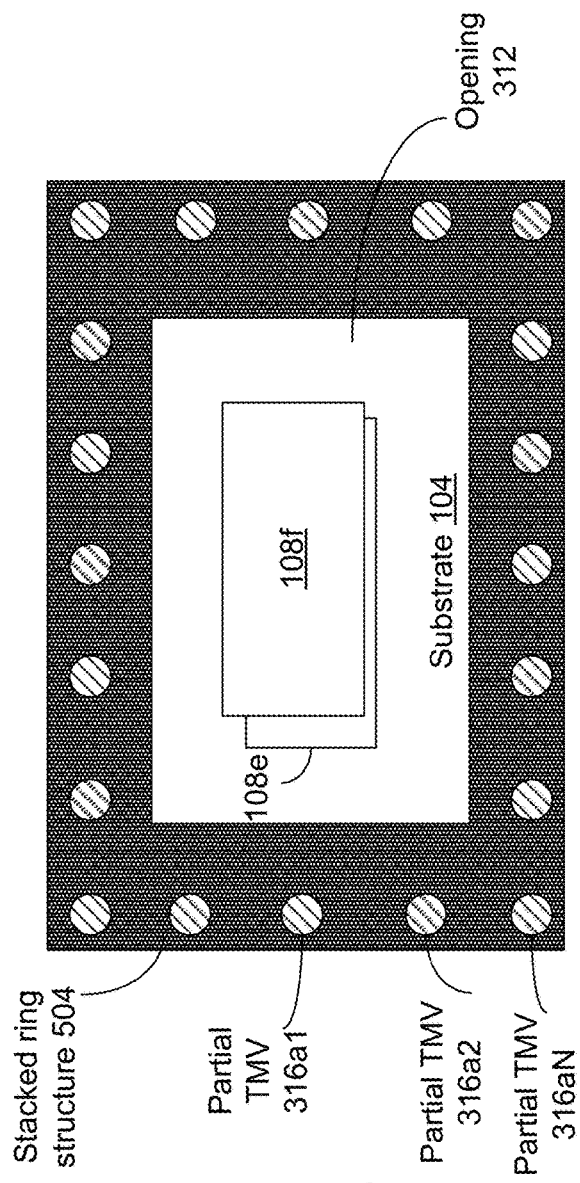

FIG. 5A illustrates a cross sectional view of another partially formed package 100b and FIG. 5B illustrates a top view of the partially formed package 100b, where the partially formed package 100b comprises the stacked rings 300a, 300b, 300c. The package 100b is formed from the package 100a, e.g., by stacking the rings 300a, 300b, and 300c to form a stacked ring structure 504, and placing the stacked ring structure 504 on the package 100a.

As illustrated in FIGS. 3B and 5A, the stacked ring structure 504 comprises the rings 300a, 300b and 300c, which are substantially aligned in the stacked ring structure 504. For example, the rings 300 are stacked while being aligned such that corresponding partial TMVs 316 also align. For example, as illustrated in FIG. 5A, the partial TMVs 316a1, 316b1 and 316c1 of the rings 300a, 300b and 300c, respectively, are aligned to form a contiguous or continuous TMV. For example, the continuous TMV formed from the combination of the partial TMVs 316a1, 316b1 and 316c1 is the TMV 116a.

The rings 300a, 300b, and 300c in the stacked ring structure 504 can be stacked by one of a plurality of manners. For example, the rings 300 can be stacked and then thermally treated, and then treated using ultrasound, so that the rings adhere to each other (e.g., a top surface of the ring 300c adheres to a bottom surface of the ring 300b, and a top surface of the ring 300b adheres to a bottom surface of the ring 300a). In another example, two rings 300a and 300b can be attached using an adhesive layer (not illustrated in the figures), where the adhesive structure also has perforations or holes corresponding to the holes of the partial TMVs 316 of the rings 300a and 300b, for example, such that the adhesive layer does not come in between two corresponding partial TMVs (e.g., such that the adhesive layer does not come in between the partial TMVs 316a1 and 316b1).

As illustrated in FIGS. 5A and 5B, the stacked ring structure 504 has the opening 312 (e.g., as discussed with respect to FIG. 3B). For example, in the top view of FIG. 5B, the substrate 104 and the stacked semiconductor chips 108f and 108e are visible through the opening 312 of the stacked ring structure 504.

FIG. 6A illustrates a cross sectional view of a package 100c and FIG. 6B illustrates a top view of the package 100c, where the package 100c is at least in part similar to the package 100 of FIGS. 1A and 1B. The package 100c is formed by depositing molding compound 112a on the package 100b of FIGS. 5A and 5B. In some embodiments, the molding compound 112a encapsulates the stacked semiconductor chips 108a, . . . , 108f, and fills the opening 312 in the stacked ring structure 504. Subsequent to depositing the molding compound 112a (or prior to depositing the molding compound 112a), interconnect structures 132 are formed over the top surfaces of the partial TMVs 316a. For example, the interconnect structure 132a is formed over the top surfaces of the partial TMV 316a1. Similar to FIG. 1B, the top view of FIG. 6B also does not illustrate the interconnect structures 132, and the top surfaces of the partial TMVs 316a are illustrated in FIG. 6B.

In some embodiments, a combination of the molding compound 112a and the stacked ring structure 504 in FIGS. 6A-6B is equivalent to the molding compound 112 of FIGS. 1A-1B. For example, the molding compound 112a forms a first section of the molding compound 112, and the rings 300a, 300b and 300c of the stacked ring structure 504 form a second section of the molding compound 112.

A difference between FIGS. 1A-1B and FIGS. 6A-6B is that the TMVs 116 in FIGS. 1A-1B are illustrated as a continuous structure, whereas in FIGS. 6A-6B, the combination of three partial TMVs form a corresponding single TMV. Furthermore, the molding compound 112 in FIGS. 1A-1B is illustrated as a single molding compound layer, whereas in FIGS. 6A-6B, there are two sections of molding compounds: molding compound formed from the stacked ring structure 504 and the molding compound 112a deposited in the opening 312.

In some embodiments, the material used for the rings 300 can be same as the molding compound 112a, or can be different from the molding compound 112a. In some embodiments, the molding compound 112a can comprise any suitable material, such as epoxy-based build-up substrate, other dielectric/organic materials, resins, epoxies, polymer adhesives, silicones, acrylics, polyimides, cyanate esters, thermoplastics, thermal interface material, and/or thermosets.

Figure 7:
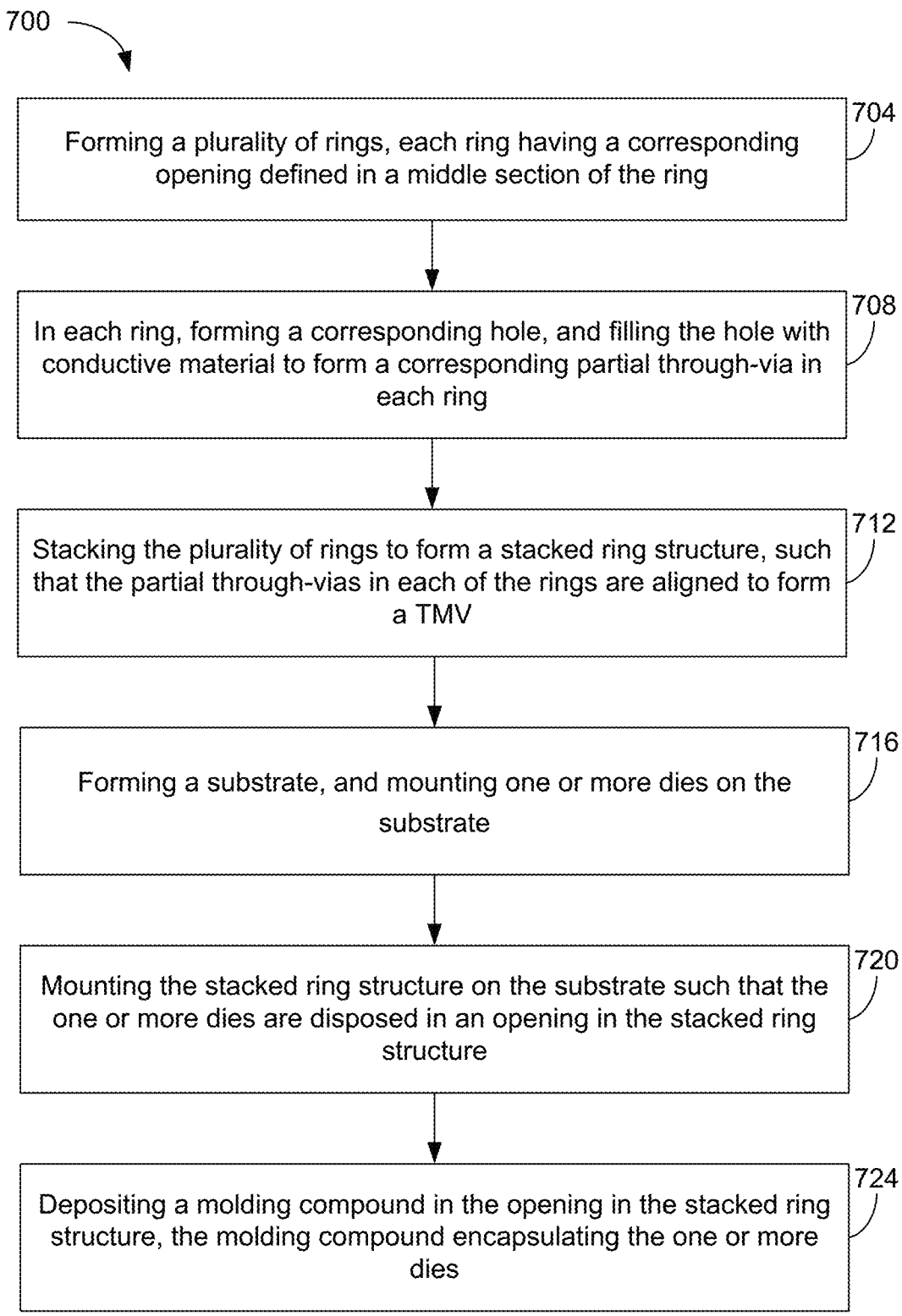
FIG. 7 illustrates a flowchart depicting a method for forming TMVs using stacked modular mold rings, according to some embodiments.

FIG. 7 illustrates a flowchart depicting a method 700 for forming TMVs using stacked modular mold rings, according to some embodiments. At 704, a plurality of rings (e.g., rings 300a, 300b, 300c of FIG. 3B) are formed. In some embodiments, each ring has a corresponding opening defined in a middle section of the ring (e.g., the ring 300a has an opening 312a defined in the middle of the ring 300a).

At 708, in each ring, a corresponding hole is formed and filed with conductive material (e.g., solder) to form a partial through-via in each ring. For example, the rings 300a, 300b, and 300c have partial TMVs 316a1, 316b1, and 316c1, respectively, as illustrated in FIG. 3B.

At 712, the plurality of rings are stacked to form a stacked ring structure (e.g., the stacked ring structure 504 of FIG. 5A). The rings are aligned while stacking, for example, such that the partial through-vias in each of the rings are aligned to form a TMV. For example, the partial TMVs 316a1, 316b1, and 316c1 are aligned to form the TMV 116a, as illustrated in FIG. 5A. In some embodiments, the rings are attached in the stacked ring structure using thermal processing and/or exposing the rings to an ultrasound, attached using adhesive, etc., e.g., as discussed in more detail herein earlier.

At 716, a substrate (e.g., the substrate 104) is formed, and one or more dies (e.g., semiconductor chips 108a, . . . , 108f) are mounted on the substrate, e.g., as illustrated in FIG. 4. At 720, the stacked ring structure is mounted on the substrate such that the one or more dies are disposed in an opening in the stacked ring structure. The opening in the stacked ring structure (e.g., opening 312 of FIG. 3B) is formed by aligning the individual openings (e.g., opening 312a in the ring 300a) of the individual rings.

At 724, a molding compound (e.g., molding compound 112a of FIGS. 6A-6B) is deposited in the opening in the stacked ring structure. In an example, the molding compound encapsulates the one or more dies.

Although FIG. 7 illustrates various operations of the method 700 in a particular order, the operations can be performed in a different order as well. Merely as an example, the formation of the substrate and mounting of the dies on the substrate, as discussed in block 716, can be performed at least in part in parallel to, or prior to the operations discussed with respect to the blocks 704 to 712 of the method 700.

There are many technical effects of the various embodiments. For example, drilling holes in individual rings 300 is easier, e.g., compared to drilling holes in the entire molding compound 112 of FIG. 1A. For example, individual rings 300 have relatively less height ha (e.g., see FIG. 3A). Accordingly, the holes in individual rings 300 can be smaller in diameter, thereby resulting in smaller diameter of the TMVs 116 in the stacked ring structure 504. In contrast, in a convention system, if a hole for a TMV is to be drilled in a molding compound with a height H, such a hole would have a large and non-uniform diameter. Thus, the teachings of this disclosure facilitate reducing the footprint of the TMVs in the package 100c, thereby enabling formation of a larger number of TMVs (and consequently, large number of connections) in the package 100c.

Figure 8:
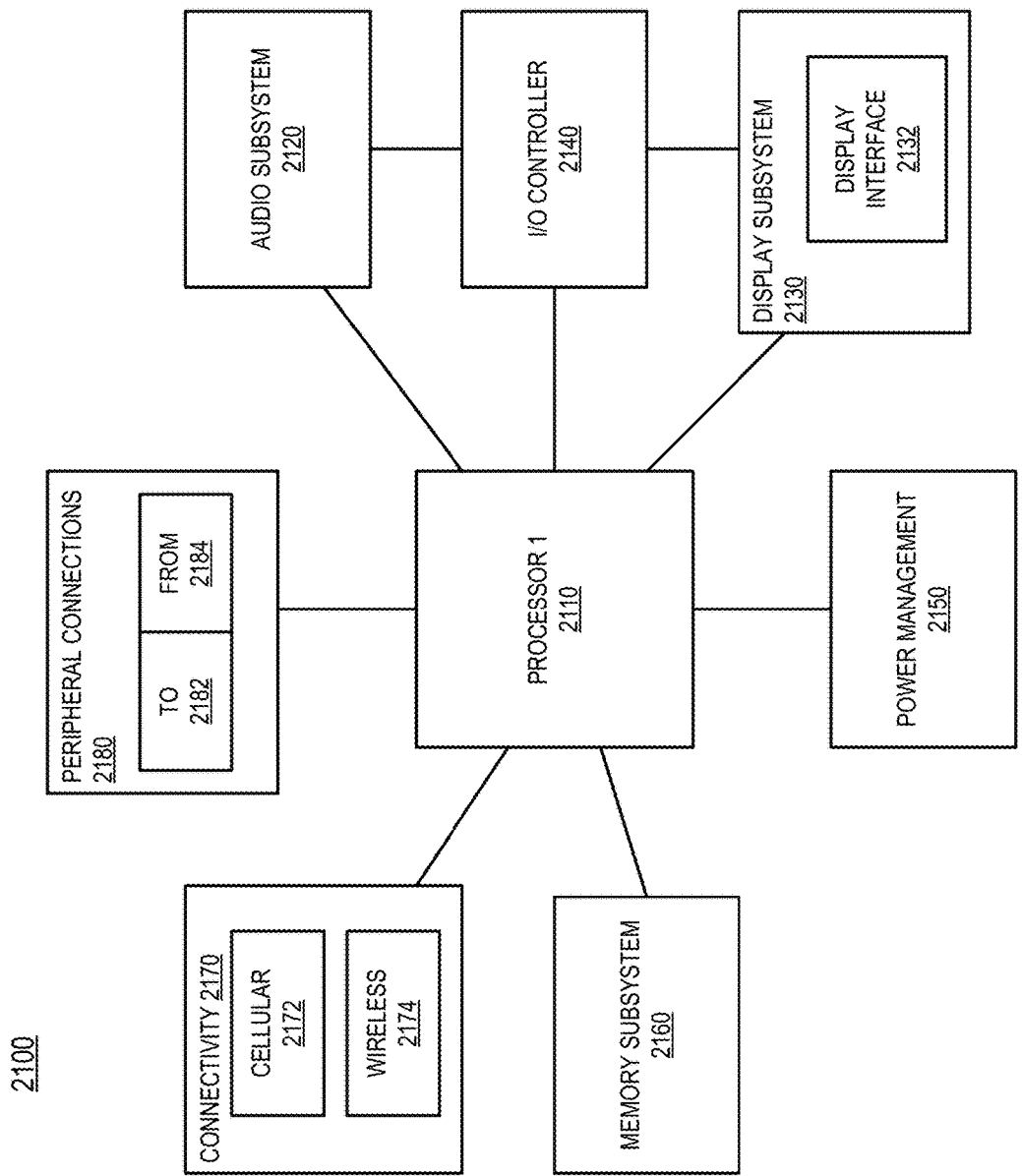
FIG. 8 illustrates a computing device, in which various TMVs are formed using a stacked ring structure, according to some embodiments.

FIG. 8 illustrates a computing device 2100, a smart device, a computing device or a computer system or a SoC (System-on-Chip) 2100, in which various TMVs (not illustrated in the figure) are formed using a stacked ring structure, according to some embodiments. It is pointed out that those elements of FIG. 8 having the same reference numbers (or names) as the elements of any other figure can operate or function in any manner similar to that described, but are not limited to such.

Here, one or more blocks forming the computing device 2100 may be packaged, for example, in the package 100c of FIGS. 6A-6B. For example, one or more TMVs in such a package can be formed using the stacked ring structure 504, which, for example, results in relatively less and uniform diameter of the TMVs.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following clauses pertain to further embodiments. Specifics in the example clauses may be used anywhere in one or more embodiments. All optional features of the apparatus described herein may also be implemented with respect to a method or process.

Clause 1. An apparatus comprising: a substrate; a stacked ring structure on the substrate, the stacked ring structure comprising a first ring and a second ring; a first partial through-mold-via (TMV) formed on the first ring; and a second partial TMV formed on the second ring, wherein the first ring and the second ring are stacked such that the first partial TMV is aligned on top of the second partial TMV.

Clause 2. The apparatus of clause 1, wherein the first partial TMV and the second partial TMV, in combination, form at least a part of a TMV that electrically interconnects the substrate with a semiconductor package.

Clause 3. The apparatus of any of clauses 1 or 2, wherein the stacked ring structure has an opening, and wherein the apparatus further comprises: a semiconductor die on the substrate within the opening of the stacked ring structure.

Clause 4. The apparatus of clause 3, further comprising: molding compound formed in the opening of the stacked ring structure, the molding compound encapsulating the semiconductor die.

Clause 5. The apparatus of clause 4, wherein: a height of the stacked ring structure is substantially equal to a height of the molding compound.

Clause 6. The apparatus of any of clauses 3-5, wherein the semiconductor die is a first semiconductor die, and wherein the apparatus further comprises: a second semiconductor die stacked on top of the first semiconductor die.

Clause 7. The apparatus of any of clauses 1-6, wherein the stacked ring structure further comprises: a third ring, wherein a third partial TMV is formed on the third ring.

Clause 8. The apparatus of clause 7, wherein: the first ring, the second ring, and the third ring are stacked such that the second partial TMV is aligned on top of the third partial TMV; and the first partial TMV, the second partial TMV, and the third partial TMV, in combination, form a TMV that electrically interconnects the substrate with a semiconductor package.

Clause 9. The apparatus of any of clauses 1-8, wherein: a first plurality of partial TMVs is formed on the first ring, the first plurality of partial TMVs including the first partial TMV; a second plurality of partial TMVs is formed on the second ring, the second plurality of partial TMVs including the second partial TMV; and wherein the first ring and the second ring are aligned such that each partial TMV of the first plurality of partial TMVs is aligned to a corresponding partial TMV of the second plurality of partial TMVs, thereby forming a plurality of TMVs.

Clause 10. The apparatus of any of clauses 1-9, wherein: the first partial TMV comprises (i) a hole within the first ring and (ii) conductive material filing the hole.

Clause 11. A package-on-package (POP) structure comprising: an apparatus according to any of clauses 1-10 as a bottom package of the apparatus; and a top package coupled to the bottom package.

Clause 12. A system comprising: a memory; a processor coupled to the memory; and a wireless interface, wherein the processor is included in the apparatus of any of clauses 1-11.

Clause 13. A system comprising: a memory; a processor coupled to the memory; and a wireless interface, wherein the memory is included in the apparatus of any of clauses 1-11.

Clause 14. A package-on-package (POP) structure comprising: a top semiconductor package; and a bottom semiconductor package, wherein the bottom semiconductor package comprises: a substrate, a molding compound formed on the substrate, and a through-mold-via (TMV) formed in the molding compound, the TMV facilitating an electrical connection between the top semiconductor package and the bottom semiconductor package, wherein the TMV is a combination of a plurality of partial TMVs that are arranged in a stack.

Clause 15. The POP structure of clause 14, wherein the molding compound comprises: a stacked ring structure comprising a plurality of rings that are arranged in a stack, wherein the stacked ring structure forms a first section of the molding compound, wherein each ring of the plurality of rings comprises a corresponding partial TMV of the plurality of partial TMVs.

Clause 16. The POP structure of clause 15, wherein the stacked ring structure comprises an opening defined in a middle section of the stacked ring structure, and wherein the molding compound further comprises: a second section of the molding compound disposed within the opening of the stacked ring structure.

Clause 17. The POP structure of any of clauses 14-16, wherein: the molding compound comprises a stacked ring structure comprising a plurality of rings that are arranged in a stack; the stacked ring structure comprises an opening defined in a middle section of the stacked ring structure; and the bottom package further comprises: one or more semiconductor chips disposed within the opening of the stacked ring structure.

Clause 18. The POP structure of clause 17, wherein: the one or more semiconductor chips comprises at least a first semiconductor chip and a second semiconductor chip; and the first semiconductor chip is mounted on the substrate and the second semiconductor chip is stacked on top of the first semiconductor chip.

Clause 19. The POP structure of any of clauses 15-17, wherein: the molding compound encapsulates the one or more semiconductor chips.

Clause 20. A method comprising: forming a first ring; forming a first partial through-mold-via (TMV) on the first ring; forming a second ring; forming a second partial TMV on the second ring; and stacking the first ring and the second ring to form a stacked ring structure, wherein stacking the first ring and the second ring comprises aligning the first ring and the second ring such that the first partial TMV is aligned on top of the second partial TMV.

Clause 21. The method of clause 20, further comprising: forming a substrate; mounting a die on the substrate; and mounting the stacked ring structure on the substrate.

Clause 22. The method of any of clauses 20 or 21, wherein: the stacked ring structure has an opening defined in a middle section of the stacked ring structure; and the stacked ring structure is mounted on the substrate such that the die is disposed within the opening in the stacked ring structure.

Clause 23. The method of clause 22, further comprising: depositing a molding compound in the opening in the stacked ring structure, the molding compound encapsulating the die.

Clause 24. The method of any of clauses 22-23, wherein the die is a first die, and the method further comprises: stacking a second die on the first die within the opening in the stacked ring structure.

Clause 25. The method of any of clauses 20-24, further comprising: forming a landing pad on section of the substrate on which the second partial TMV is mounted; and forming an interconnect structure of a top surface of the first partial TMV.

Clause 26. The method of clause 23-25, wherein the substrate is electrically connected to an external package via the landing pad, the second partial TMV, the first partial TMV, and the interconnect structure.

Clause 27. The method of any of clauses 23-26, wherein a material used for the molding compound is same as the material used for the first ring.

Clause 28. A method of forming a package-on-package (POP) structure, the method comprising: forming a top semiconductor package; forming a bottom semiconductor package; and mounting the top semiconductor package on the bottom semiconductor package to form the POP structure, wherein forming the bottom semiconductor package comprises: forming a substrate, forming a molding compound on the substrate, and forming a through-mold-via (TMV) in the molding compound, the TMV facilitating an electrical connection between the top semiconductor package and the bottom semiconductor package, wherein the TMV is a combination of a plurality of partial TMVs that are arranged in a stack.

Clause 29. The method of clause 28, wherein forming the molding compound comprises: forming a stacked ring structure comprising a plurality of rings that are arranged in a stack, wherein the stacked ring structure forms a first section of the molding compound, wherein each ring of the plurality of rings comprises a corresponding partial TMV of the plurality of partial TMVs.

Clause 30. The method of clause 29, wherein the stacked ring structure comprises an opening defined in a middle section of the stacked ring structure, and forming the molding compound further comprises: forming a second section of the molding compound within the opening of the stacked ring structure.

Clause 31. The method of clause 28, wherein the molding compound comprises a stacked ring structure comprising a plurality of rings that are arranged in a stack, wherein the stacked ring structure comprises an opening defined in a middle section of the stacked ring structure, and wherein forming the bottom package further comprises: disposing one or more semiconductor chips within the opening of the stacked ring structure.

Clause 32. The method of clause 31, wherein the one or more semiconductor chips comprises at least a first semiconductor chip and a second semiconductor chip, and wherein disposing the one or more semiconductor chips comprises: mounting the first semiconductor chip on the substrate; and stacking the second semiconductor chip on top of the first semiconductor chip.

Clause 33. The method of clause 31, wherein: the molding compound encapsulates the one or more semiconductor chips.

Clause 34. An apparatus comprising means to perform a method in any of the clauses 20 to 32.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a substrate;
a stacked ring structure on the substrate, the stacked ring structure comprising a first ring and a second ring, wherein each of the first and second rings comprise one more dielectric materials;
a first partial through-mold-via (TMV) comprising conductive material within a first hole that extends through a thickness of the first ring; and
a second partial TMV comprising conductive material within a second hole that extends through a thickness of the second ring,
wherein the first ring and the second ring are in a stack and wherein the first partial TMV is in at least partial alignment with the second partial TMV as a conductive path through the one or more dielectric materials.

2. The apparatus of claim 1, wherein a TMV that electrically interconnects the substrate with a semiconductor package comprises the first partial TMV and the second partial TMV.

3. The apparatus of claim 1, wherein the stacked ring structure has an opening, and wherein the apparatus further comprises:

a semiconductor die on the substrate within the opening of the stacked ring structure.

4. The apparatus of claim 3, further comprising:
molding compound formed in the opening of the stacked ring structure, the molding compound encapsulating the semiconductor die.

5. The apparatus of claim 4, wherein:
a height of the stacked ring structure is substantially equal to a height of the molding compound.

6. The apparatus of claim 3, wherein the semiconductor die is a first semiconductor die, and wherein the apparatus further comprises:
a second semiconductor die stacked on top of the first semiconductor die.

7. The apparatus of claim 1, wherein the stacked ring structure further comprises:
a third ring, wherein a third partial TMV comprises conductive material within a third hole that extends through a thickness of the third ring.

8. The apparatus of claim 7, wherein:
the first ring, the second ring, and the third ring are stacked such that the second partial TMV is in at least partial alignment with the third partial TMV; and
a TMV that electrically interconnects the substrate with a semiconductor package comprising the first partial TMV, the second partial TMV, and the third partial TMV.

9. The apparatus of claim 1, wherein:
the first partial TMV is one of a first plurality of partial TMVs on the first ring;
the second partial TMV is one of a second plurality of partial TMVs on the second ring; and
wherein each of the first plurality of partial TMVs is aligned to a corresponding one of the second plurality of partial TMVs.

10. A package-on-package (POP) structure comprising:
a top semiconductor package; and
a bottom semiconductor package, wherein the bottom semiconductor package comprises:
a substrate,
a mold compound over the substrate, wherein the mold compound comprises a plurality of rings of dielectric material in a stack over the substrate; and
an electrical connection between the top semiconductor package and the bottom semiconductor package, the electrical connection comprising a through-mold-via (TMV) that extends through the mold compound, wherein the TMV comprises a plurality of partial TMVs in a stack, wherein each of the partial TMVs comprises a conductive material within a hole that extends through a thickness of individual ones of the rings.

11. The POP structure of claim 10 wherein the stacked ring structure, surrounds and
a second section of the molding compound.

12. The POP structure of claim 11, wherein:
the bottom package further comprises:
one or more semiconductor chips within the second section of the molding compound and surrounded by the stacked ring structure.

13. The POP structure of claim 12, wherein:
the one or more semiconductor chips comprises at least a first semiconductor chip and a second semiconductor chip; and
the first semiconductor chip is interconnected to the substrate and the second semiconductor chip is in a stack, on top of the first semiconductor chip.

14. The POP structure of claim 12, wherein:
the second section of the molding compound encapsulates the one or more semiconductor chips.

15. A method comprising:
forming a first ring comprising a dielectric material;
forming a first partial through-mold-via (TMV) through a thickness of the first ring by etching a first hole through the dielectric material and filling the first hole with a conductive material;
forming a second ring comprising a dielectric material;
forming a second partial TMV through a thickness of the second ring by etching a second hole through the dielectric material and filling the second hole with a conductive material; and
stacking the first ring and the second ring into a stacked ring structure in which the first partial TMV is in at least partial alignment with the second partial TMV to provide an electrical path through the first and second rings.

16. The method of claim 15, further comprising:
forming a substrate;
mounting a die on the substrate; and
mounting the stacked ring structure on the substrate with the die surrounded by the stacked ring structure.

17. The method of claim 16, further comprising:
depositing a mold compound within the opening in the stacked ring structure, the molding compound encapsulating the die.

18. The method of claim 15, further comprising:
forming a landing pad on a section of the substrate on which the second partial TMV is mounted; and
forming an interconnect structure over a top surface of the first partial TMV,
wherein the substrate is electrically connected to an external package via the landing pad, the second partial TMV, the first partial TMV, and the interconnect structure.

* * * * *